US012150356B2

(12) United States Patent
Sin et al.

(10) Patent No.: US 12,150,356 B2
(45) Date of Patent: Nov. 19, 2024

(54) DISPLAY DEVICE

(71) Applicant: LG Display Co., Ltd., Seoul (KR)

(72) Inventors: Uisu Sin, Seoul (KR); Youngsun Jang, Paju-si (KR); ByungJun Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/448,744

(22) Filed: Aug. 11, 2023

(65) Prior Publication Data

US 2024/0215356 A1 Jun. 27, 2024

(30) Foreign Application Priority Data

Dec. 26, 2022 (KR) ........................ 10-2022-0184279

(51) Int. Cl.
*G09G 3/3233* (2016.01)
*G06F 3/041* (2006.01)
*H10K 59/124* (2023.01)
*H10K 59/131* (2023.01)
*H10K 59/40* (2023.01)
*H10K 59/80* (2023.01)

(52) U.S. Cl.
CPC ......... *H10K 59/131* (2023.02); *G06F 3/0412* (2013.01); *G09G 3/3233* (2013.01); *H10K 59/124* (2023.02); *H10K 59/40* (2023.02); *H10K 59/873* (2023.02); *G09G 2300/0426* (2013.01); *G09G 2300/0842* (2013.01); *G09G 2354/00* (2013.01)

(58) Field of Classification Search
CPC ................ G06F 3/0412; G09G 3/3233; G09G 2300/0426; G09G 2300/0842
See application file for complete search history.

(56) References Cited

U.S. PATENT DOCUMENTS

| 10,714,563 | B2 | 7/2020 | Lee et al. |
| 11,800,758 | B2* | 10/2023 | Jo ........................ H10K 59/131 |
| 2019/0198598 | A1 | 6/2019 | Lee et al. |
| 2023/0106605 | A1* | 4/2023 | Yoo ...................... H10K 50/841 |
| | | | 257/40 |

FOREIGN PATENT DOCUMENTS

KR 10-2019-0077155 A 7/2019

\* cited by examiner

*Primary Examiner* — Kevin M Nguyen
(74) *Attorney, Agent, or Firm* — Fenwick & West LLP

(57) ABSTRACT

A display device according to an exemplary embodiment of the present disclosure includes a substrate that includes a non-active area and an active area, the non-active area including a bending area and a pad area. The display device also includes a gate driving circuit, a driving integrated circuit, and a plurality of lines connecting the driving integrated circuit to the gate driving circuit. The plurality of lines includes a first group of lines that transmits a signal having a first average voltage, a second group of lines that transmits a clock signal, and a third group of lines that transmits a signal having a second average voltage different from the first average voltage. The second group of lines is located between the first group of lines and the third group of lines.

15 Claims, 7 Drawing Sheets

DISPLAY DEVICE

CROSS-REFERENCE TO RELATED APPLICATION

This application claims the priority of Republic of Korea Patent Application No. 10-2022-0184279 filed on Dec. 26, 2022, in the Korean Intellectual Property Office, the contents of which are incorporated herein by reference in their entirety.

BACKGROUND

Technical Field

The present disclosure relates to a display device, and more particularly, to a display device which can suppress the occurrence of a crack of lines in a bending area.

Description of the Related Art

As an information age enters, the field of display devices for visually displaying electrical information signals is rapidly developing. Thus, studies for developing performances such as thinning, weight reduction, and low power consumption have continued.

Representative examples of the display devices include a liquid crystal display (LCD) device, a field emission display (FED) device, an electro-wetting display (EWD) device, an organic light emitting display (OLED) device, and the like.

An electroluminescent display device represented as the OLED device is a self-emitting display device and does not require a separate light source unlike the LCD device. Thus, the electroluminescent display device can be manufactured in a lightweight and thin form. Further, the electroluminescent display device is not only advantageous in terms of power consumption by low voltage driving, but also has excellent color expression ability, response speed, viewing angle and contrast ratio (CR). Therefore, the electroluminescent display device is expected to be utilized in various fields.

SUMMARY

An object to be achieved by the present disclosure is to provide a display device which may suppress the occurrence of a crack of lines disposed in a bending area.

Another object to be achieved by the present disclosure is to provide a display device which may suppress the occurrence of a crack of lines disposed in a bending area to improve reliability.

Objects of the present disclosure are not limited to the above-mentioned objects, and other objects, which are not mentioned above, can be clearly understood by those skilled in the art from the following descriptions.

According to an embodiment of the present disclosure, the display device includes a substrate that includes a non-active area and an active area, the non-active area including a bending area and a pad area. Also, the display device includes a gate driving circuit disposed in the non-active area, and a driving integrated circuit disposed in the pad area. Further, the display device includes a plurality of lines disposed in the bending area and connecting the driving integrated circuit to the gate driving circuit. The plurality of lines includes a first group of lines that transmits a signal having a first average voltage, and a second group of lines that transmits a clock signal. Also, the plurality of lines includes a third group of lines that transmits a signal having a second average voltage, which is different from the first voltage. The second group of lines is located between the first group and the third group.

Other detailed matters of the exemplary embodiments are included in the detailed description and the drawings.

According to the present disclosure, a display device includes a plurality of lines that applies a signal from a driving integrated circuit disposed in a pad area to a gate driver. The plurality of lines are disposed in an order of the level of an average voltage of a signal transmitted by each of the plurality of lines. Thus, it is possible to suppress the occurrence of a crack in the plurality of lines and thus possible to improve the long-term reliability of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
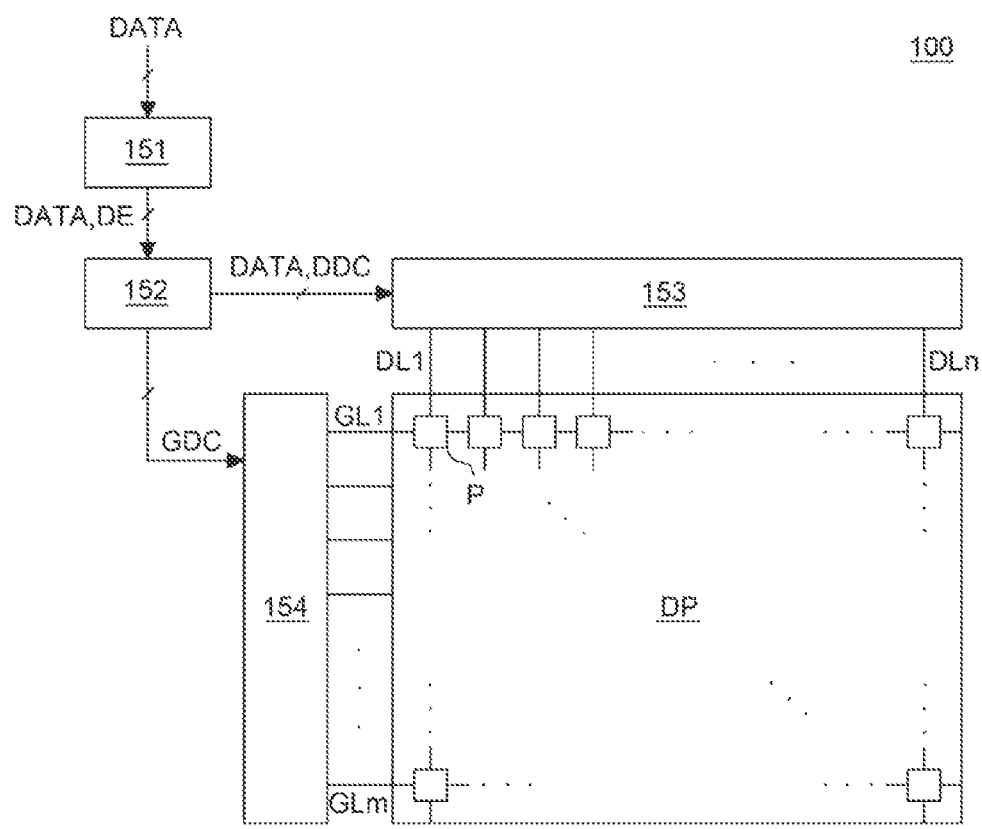
FIG. 1 is a block diagram showing a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like or similar reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only" and the like. Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" and the like.

When an element or layer is disposed "on" another element or layer, the element or layer may be disposed directly on another element or layer, or other element or layer may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like or similar reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a block diagram showing a display device according to an exemplary embodiment of the present disclosure.

Referring to FIG. 1, a display device 100 according to an exemplary embodiment of the present disclosure may include an image processor 151, a timing controller 152, a data driver 153, a gate driver 154, and a display panel DP.

The image processor 151 may output a data signal DATA, a data enable signal DE, and the like supplied from the outside. The image processor 151 may output one or more of a vertical sync signal, a horizontal sync signal, and a clock signal in addition to the data enable signal DE.

The timing controller 152 receives the data signal DATA and a driving signal including the data enable signal DE or the vertical sync signal, the horizontal sync signal, the clock signal, and/or the like from the image processor 151. The timing controller 152 may output a gate timing control signal GDC for controlling operation timing of the gate driver 154 and a data timing control signal DDC for controlling operation timing of the data driver 153 based on the driving signal.

Also, the data driver 153 may sample and latch the data signal DATA supplied from the timing controller 152 in response to the data timing control signal DDC supplied from the timing controller 152. Then, the data driver 153 may convert the sampled and latched data signal DATA into a gamma reference voltage and output the gamma reference voltage. The data driver 153 may output the data signal DATA through data lines DL1 to DLn.

The gate driver 154 may output a gate signal while shifting the level of a gate voltage in response to the gate timing control signal GDC supplied from the timing controller 152. The gate driver 154 may output the gate signal through gate lines GL1 to GLm.

The display panel DP may display an image while sub-pixels P emit light in response to the data signal DATA and the gate signal respectively received from the data driver 153 and the gate driver 154. A detailed structure of each sub-pixel P will be described with reference to FIG. 2 and FIG. 4.

Figure 2:
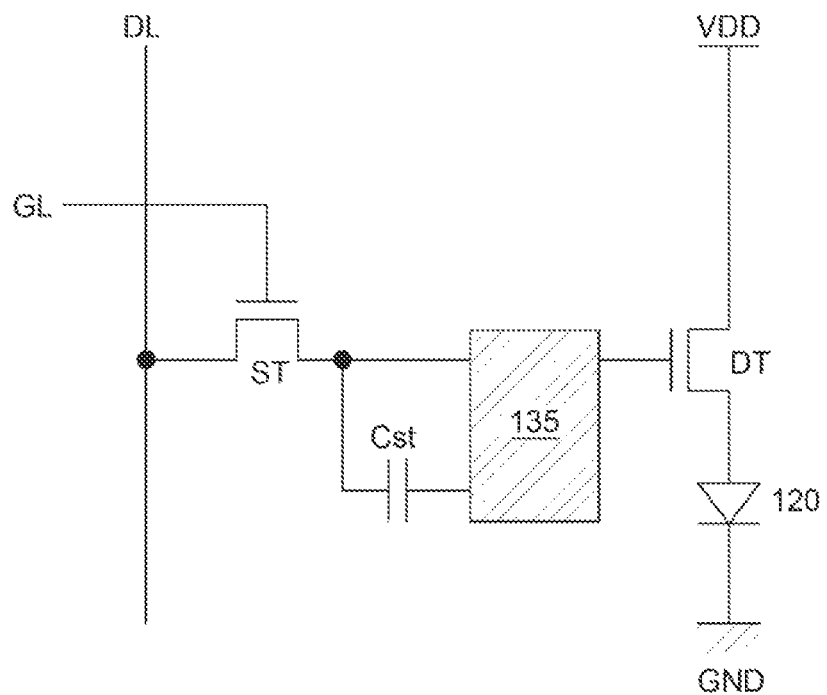
FIG. 2 is a circuit diagram of a sub-pixel of the display device according to an exemplary embodiment of the present disclosure.

FIG. 2 is a circuit diagram of a sub-pixel of the display device according to an exemplary embodiment of the present disclosure.

Referring to FIG. 2, the sub-pixel of the display device according to an exemplary embodiment of the present disclosure may include a switching transistor ST, a driving transistor DT, a compensation circuit 135, and a light emitting diode 120.

The light emitting diode 120 may operate to emit light in response to a driving current formed by the driving transistor DT.

The switching transistor ST may perform a switching operation so that a data signal supplied through a data line DL is stored in a capacitor Cst as a data voltage in response to a gate signal supplied through a gate line GL.

The driving transistor DT may operate so that the driving current flows between a high potential power line VDD and a low potential power line GND in response to the data voltage stored in the capacitor Cst.

The compensation circuit 135 is a circuit for compensating for a threshold voltage of the driving transistor DT. The compensation circuit 135 may include one or more thin film transistors and a capacitor. A configuration of the compensation circuit 135 may be variously modified depending on a compensation method.

The sub-pixel shown in FIG. 2 has a 2T (transistor)-1C (capacitor) structure including the switching transistor ST, the driving transistor DT, the capacitor Cst, and the light emitting diode 120. However, when the compensation circuit 135 is added to the sub-pixel, the sub-pixel may have various structures of 3T1C, 4T2C, 5T2C, 6T1C, 6T2C, 7T1C, 7T2C, and the like.

Figure 3:
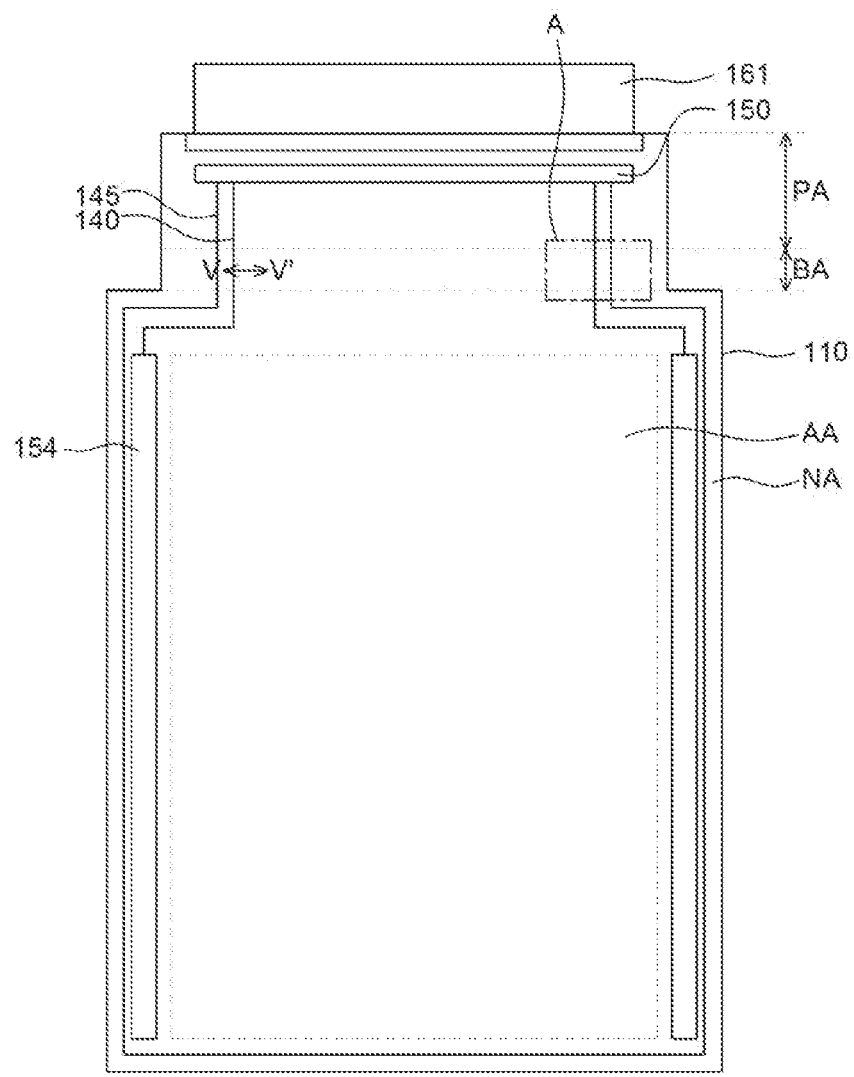
FIG. 3 is a plan view of the display device according to an exemplary embodiment of the present disclosure.

FIG. 3 is a plan view of the display device according to an exemplary embodiment of the present disclosure.

FIG. 3 shows, as an example, a state where a substrate 110 of the display device 100 according to an exemplary embodiment of the present disclosure is not bent.

For the convenience of description, FIG. 3 illustrates the substrate 110, a driving integrated circuit 150, the gate driver 154, a circuit element 161, a plurality of lines 140, and a crack detection line 145 among various components of the display device 100.

The substrate 110 is configured to support various components included in the display device 100, and may be made of an insulating material. The substrate 110 may be made of a flexible material that may be bent. The substrate 110 may be made of a transparent insulating material. For example, the substrate 110 may be made of a plastic material such as polyimide (PI).

A plurality of gate lines and a plurality of data lines may be disposed intersecting each other on the substrate 110. A plurality of pixels P are defined at intersections of the plurality of gate lines and the plurality of data lines. An area in which the plurality of pixels P are disposed may be referred to as an active area AA. An area which is disposed outside the active area AA and in which the plurality of pixels P are not disposed may be referred to as a non-active area NA.

A display unit for displaying an image and a circuit unit for driving the display unit may be formed in the active area AA. For example, if the display device 100 is an organic light emitting display device, the display unit may include a light emitting diode. That is, the display unit may include an anode, an organic emission layer on the anode, and a cathode on the organic emission layer. The organic emission layer may be composed of, for example, a hole transport layer, a hole injection layer, an organic emission layer, an electron injection layer, and an electron transport layer. However, if the display device 100 is a liquid crystal display device, the display unit may include a liquid crystal layer. Hereinafter, for the convenience of description, the display device 100 will be described as an organic light emitting display device, but is not limited thereto.

The circuit unit may include various transistors, capacitors and lines for driving the light emitting diode. For example, the circuit unit may be composed of various components such as a driving transistor, a switching transistor, a storage capacitor, a gate line, and a data line. However, the present disclosure is not limited thereto.

The non-active area NA is an area where an image is not displayed. A circuit, such as the gate driver 154, and various lines for driving the display unit disposed in the active area AA may be disposed in the non-active area NA.

The non-active area NA may be defined as an area enclosing the active area AA as shown in FIG. 3. However, the present disclosure is not limited thereto. The non-active area NA may be defined as an area extending from the active area AA. Also, the non-active area NA may be defined as an area extending from a plurality of sides of the active area AA.

The non-active area NA may further include a pad area PA.

The pad area PA may be formed to receive a data driving signal from an external power supply or to transmit and receive a touch signal.

A driving integrated circuit (DIC) 150 may be located in the pad area.

Also, the circuit element 161, which is disposed in a further outer portion of the substrate 110 than the driving integrated circuit 150, may be bonded to the pad area PA.

For example, the circuit element 161 may be a flexible printed circuit, but is not limited thereto.

The driving integrated circuit 150 disposed in the pad area PA may be connected to the plurality of lines 140. Also, the driving integrated circuit 150 may be connected to the plurality of data lines or the plurality of gate lines disposed in the active area AA via the gate driver 154 through the plurality of lines 140. Thus, a driving signal from the driving integrated circuit 150 disposed in the pad area PA may be applied to each of the plurality of pixels P.

The plurality of lines 140 will be described later with reference to FIG. 5 and FIG. 6.

Meanwhile, the non-active area NA may further include the crack detection line 145. The crack detection line 145 is disposed outside the plurality of lines 140, specifically in a further outer portion of the substrate 110 than the plurality of lines 140. Also, the crack detection line 145 is disposed to enclose the active area AA.

For example, the crack detection line 145 may be connected to the driving integrated circuit 150. When a crack occurs in the crack detection line 145, the driving integrated circuit 150 may detect whether a crack occurs in the crack detection line 145.

For example, the driving integrated circuit 150 may detect whether a crack occurs in the crack detection line 145 based on a resistance value changed when a crack occurs in the crack detection line 145.

Therefore, according to an exemplary embodiment of the present disclosure, it is possible to detect whether a crack occurs outside the plurality of lines 140 and thus possible to minimize or reduce a defect rate of the display device. Accordingly, the reliability of the display device may be improved.

Meanwhile, a bending area BA to bend a part of the non-active area NA in one direction may be located between the active area AA and the pad area PA in the non-active area NA.

Since an image is not displayed in the non-active area NA, the non-active area NA does not need to be visible from an upper surface of the substrate 110. Thus, a part of the non-active area NA of the substrate 110 is bent to reduce the non-active area NA while securing an area for the lines and the driving circuit.

For example, the display device according to an exemplary embodiment of the present disclosure may be bent in a rear side direction so that a lower edge of the substrate 110 has a predetermined curvature.

The lower edge of the substrate 110 may correspond to an outer side of the active area AA, and may correspond to an area where the driving integrated circuit 150 and the pad area PA are located. As the substrate 110 is bent, the driving integrated circuit 150 and the pad area PA may be located to overlap the active area AA in a rear side direction of the active area AA. Therefore, a bezel area which is recognized from the front surface of the display device 100 may be minimized or reduced. Thus, a bezel width may be reduced and a sense of beauty may be enhanced.

Hereinafter, a cross-sectional structure of the display device 100 will be described in more detail with further reference to FIG. 4.

Figure 4:
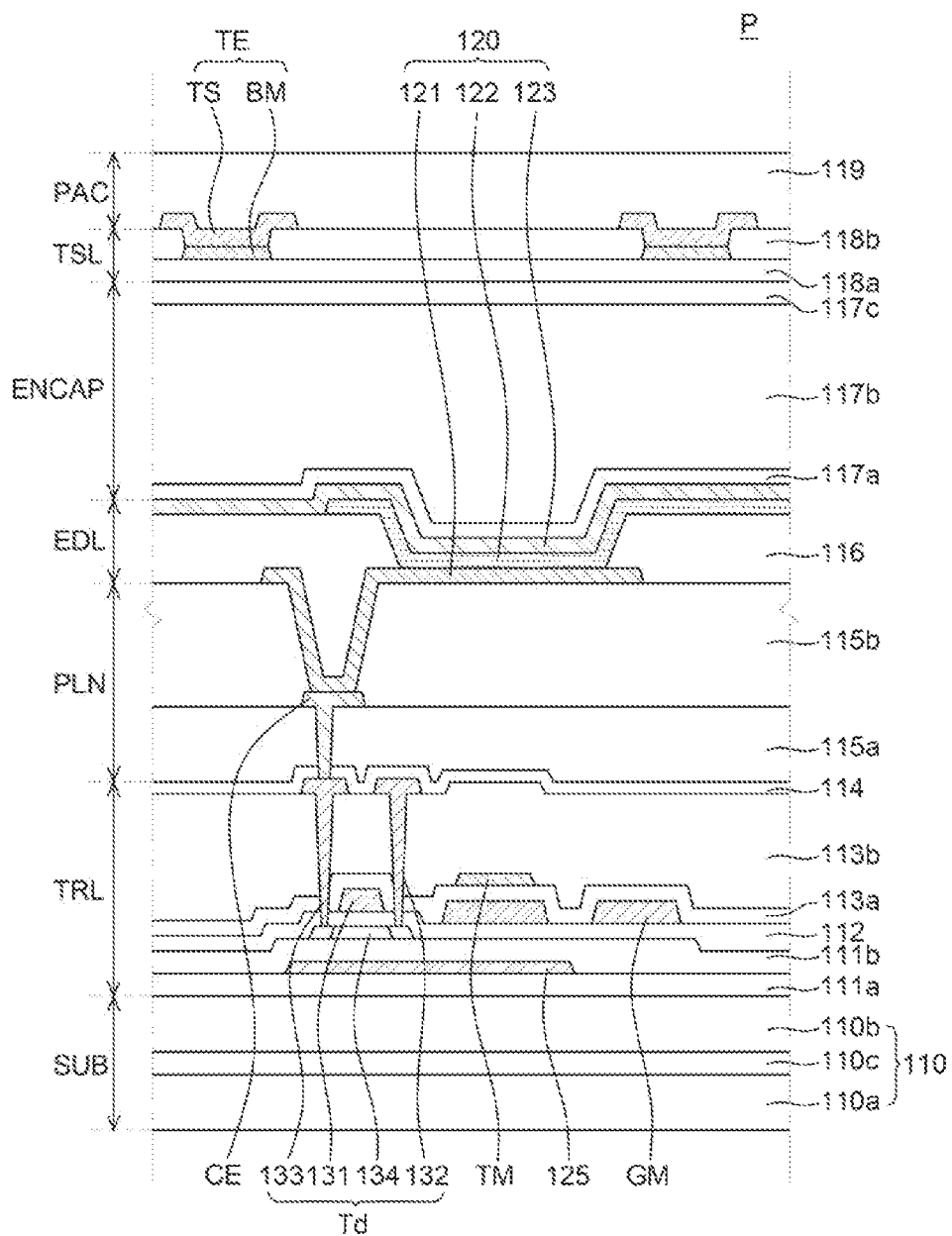
FIG. 4 is a cross-sectional view illustrating a pixel disposed in an active area of the display device according to an exemplary embodiment of the present disclosure.

FIG. 4 is a cross-sectional view illustrating a pixel P disposed in an active area of the display device according to an exemplary embodiment of the present disclosure.

Referring to FIG. 4, the display device 100 according to an exemplary embodiment of the present disclosure may include a transistor layer TRL on a substrate SUB, and a planarization layer PLN on the transistor layer TRL. Also, a light emitting diode layer EDL may be disposed on the planarization layer PLN, and an encapsulation layer ENCAP may be disposed on the light emitting diode layer EDL. Further, a touch sensing layer TSL may be disposed on the encapsulation layer ENCAP, and a protective layer PAC may be disposed on the touch sensing layer TSL.

The substrate SUB serves to support and protect components of a flexible display device disposed thereon.

The substrate 110 may be made of glass, or a plastic material having flexibility. If the substrate (SUB) 110 is made of a plastic material, it may be made of, for example, polyimide (PI). If the substrate 110 is made of PI, a manufacturing process of the display device 100 is performed in a state where a support substrate made of glass is disposed under the substrate 110. After the manufacturing process of the display device 100 is completed, the support substrate may be released. After the support substrate is released, a back plate for supporting the substrate 110 may be disposed under the substrate 110.

For example, if the back plate is further disposed under the substrate 110, the back plate may not be disposed at a portion overlapping the bending area BA of the substrate 110. However, the present disclosure is not limited thereto.

If the substrate 110 is made of polyimide (PI), moisture may permeate into a thin film transistor Td (for example, a driving transistor) or the light emitting diode 120 through the substrate 110 made of polyimide (PI), which may result in degradation of performance of the display device 100. The display device 100 according to an exemplary embodiment of the present disclosure may be made of double polyimide (PI) to suppress degradation of performance of the display device 100 caused by permeation of moisture. Further, an inorganic film is formed between two polyimide (PI) layers. Therefore, it is possible to suppress permeation of moisture components through a lower polyimide (PI) layer and thus possible to improve the performance reliability of the product.

Since the display device 100 according to an exemplary embodiment of the present disclosure includes the inorganic film formed between the two polyimide (PI) layers, it is possible to block electric charges charged in the lower polyimide (PI) layer. Therefore, it is possible to improve reliability of the product. Also, a process of forming a metal layer for blocking electric charges charged in the polyimide (PI) layer may be omitted. Therefore, it is possible to simplify the manufacturing process and reduce the manufacturing cost.

As for display device 100 using polyimide (PI) for the substrate 110, it is very important to secure the environmental reliability and performance reliability of the panel.

Therefore, the display device 100 according to an exemplary embodiment of the present disclosure may implement a structure using double polyimide (PI) for the substrate 110 to secure the environmental reliability of the product. For example, the substrate 110 of the display device 100 may include a first polyimide layer 110a, a second polyimide layer 110b, and an inorganic insulating layer 110c formed between the first polyimide layer 110a and the second polyimide layer 110b. However, the present disclosure is not limited thereto. If electric charges are charged in the first polyimide layer 110a, the inorganic insulating layer 110c may serve to block the influence of the electric charges on the thin film transistor Td through the second polyimide layer 110b. Also, the inorganic insulating layer 110c may serve to block upward permeation of moisture components through the second polyimide layer 110b.

The inorganic insulating layer 110c may be a single layer or a multilayer of silicon nitride (SiNx) or silicon oxide (SiOx). In the display device 100 according to an exemplary embodiment of the present disclosure, the inorganic insulating layer 110c may be made of a silicon oxide (SiOx) material. For example, the inorganic insulating layer 110c may be made of a silica or silicon dioxide ($SiO_2$) material, but is not limited thereto. The inorganic insulating layer 110c may be formed as a double layer of silicon dioxide ($SiO_2$) and silicon nitride (SiNx).

In the active area AA, various patterns (for example, 131, 132, 133 and 134), various insulating films (for example, 111a, 111b, 112, 113a, 113b and 114), and various metal patterns (for example, TM, GM and 125) for forming a transistor such as the thin film transistor Td may be disposed in the transistor layer TRL.

Hereinafter, a lamination structure of the transistor layer TRL will be described in more detail.

A multi-buffer layer 111a may be disposed on the substrate 110, and an active buffer layer 111b may be disposed on the multi-buffer layer 111a.

A metal layer 125 may be disposed on the multi-buffer layer 111a.

Herein, the metal layer 125 may serve as a light shield, and may also be referred to as a light shielding layer.

The active buffer layer 111b may be disposed on the metal layer 125.

An active layer 134 of the thin film transistor Td may be disposed on the active buffer layer 111b.

Herein, the active layer 134 may be made of amorphous silicon or polycrystalline silicon, but is not limited thereto. Polycrystalline silicon has superior mobility, low energy power consumption and excellent reliability compared to amorphous silicon, and thus, may be applied to a driving thin film transistor within a pixel.

Alternatively, the active layer 134 may be made of an oxide semiconductor. The oxide semiconductor has excellent mobility and uniformity. For example, the oxide semiconductor may include a quaternary metal oxide such as an indium tin gallium zinc oxide (InSnGaZnO)-based material. Also, the oxide semiconductor may include a ternary metal oxide such as an indium gallium zinc oxide (InGaZnO)-based material, an indium tin zinc oxide (InSnZnO)-based material, a tin gallium zinc oxide (SnGaZnO)-based material, an aluminum gallium zinc oxide (AlGaZnO)-based material, an indium aluminum zinc oxide (InAlZnO)-based material, and a tin aluminum zinc oxide (SnAlZnO)-based material. Further, the oxide semiconductor may include a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, and an indium gallium oxide (InGaO)-based material. Further, the oxide semiconductor may include a single metal oxide such as an indium oxide (InO)-based material, a tin oxide (SnO)-based material, and a zinc oxide (ZnO)-based material. Composition ratios of respective elements included in the oxide semiconductor are not limited.

The oxide thin film transistor Td including the active layer 134 made of an oxide semiconductor has superior off-current characteristics compared to a conventional low temperature polycrystalline silicon (LTPS) thin film transistor. Therefore, it may be GIP-driven at 1 Hz to 10 Hz and thus may implement low power driving.

The active layer 134 may include a source region and a drain region containing p-type or n-type impurities, and a channel region between the source region and the drain region. The active layer 134 may further include lightly doped regions between the channel region and the source and drain regions adjacent thereto.

The source region and the drain region are highly doped with the impurities, and may be respectively connected to a source electrode 132 and a drain electrode 133 of the thin film transistor Td.

P-type impurities or n-type impurities may be used for the impurity ions. The p-type impurities may be one of boron (B), aluminum (Al), gallium (Ga), and/or indium (In). The n-type impurities may be one of phosphorus (P), arsenic (As), and/or antimony (Sb).

The channel region of the active layer 134 may be doped with the n-type impurities or the p-type impurities depending on the structure of an NMOS or PMOS thin film transistor. An NMOS or PMOS thin film transistor may be applied to the thin film transistor included in the flexible display device according to an exemplary embodiment of the present disclosure.

A gate insulating film 112 may be disposed on the active layer 134. The gate insulating film 112 may be a single layer or a multilayer of silicon oxide (SiOx) or silicon nitride (SiNx).

Also, a gate electrode 131 of the thin film transistor Td may be disposed on the gate insulating film 112. The gate electrode 131 may be disposed on the gate insulating film 112 so as to overlap the active layer 134. The gate electrode 131 may be made of various conductive materials such as magnesium (Mg), aluminum (Al), nickel (Ni), chromium (Cr), molybdenum (Mo), tungsten (W), gold (Au), or an alloy thereof, but is not limited thereto.

A gate material layer GM may be disposed on the gate insulating film 112 at a position different from the formation position of the thin film transistor Td.

A first interlayer insulating film 113a may be disposed on the gate electrode 131 and the gate material layer GM. A metal pattern TM may be disposed on the first interlayer insulating film 113a. A second interlayer insulating film 113b may be disposed while covering the metal pattern TM disposed on the first interlayer insulating film 113a.

The source electrode 132 and the drain electrode 133 of the thin film transistor Td may be disposed on the second interlayer insulating film 113b.

The source electrode 132 and the drain electrode 133 may be connected to respective sides of the active layer 134 through contact holes formed in the second interlayer insulating film 113b, the first interlayer insulating film 113a, and the gate insulating film 112. The source electrode 132 and the drain electrode 133 may be made of various conductive materials such as magnesium (Mg), aluminum (Al), nickel (Ni), chromium (Cr), molybdenum (Mo), tungsten (W), gold (Au), or an alloy thereof. However, the present disclosure is not limited thereto.

A portion of the active layer 134 overlapping the gate electrode 131 is the channel region. One of the source electrode 132 and/or the drain electrode 133 is connected to one side of the channel region in the active layer 134, and the other is connected to the other side of the channel region in the active layer 134.

A passivation layer 114 may be disposed on the source electrode 132 and the drain electrode 133. The passivation layer 114 serves to protect the thin film transistor Td, and may be an inorganic film of, for example, silicon oxide (SiOx) or silicon nitride (SiNx), or a multilayer thereof.

The planarization layer PLN may be located on the transistor layer TRL.

The planarization layer PLN may include a first planarization layer 115a and a second planarization layer 115b. The planarization layer PLN protects the thin film transistor Td and planarizes an upper part of the thin film transistor Td.

The first planarization layer 115a may be disposed on the passivation layer 114.

A connection electrode CE may be disposed on the first planarization layer 115a.

The connection electrode CE may be connected to one of the source electrode 132 and the drain electrode 133 through a contact hole formed in the first planarization layer 115a.

The second planarization layer 115b may be disposed on the connection electrode CE.

The light emitting diode layer EDL may be located on the second planarization layer 115b.

Hereinafter, a lamination structure of the light emitting diode layer EDL will be described in detail.

An anode 121 may be disposed on the second planarization layer 115b. Herein, the anode 121 may be electrically connected to a connection electrode CE through a contact hole formed in the second planarization layer 115b. The anode 121 may be made of a metallic material.

For example, the display device 100 may be of a top emission type in which light emitted from the light emitting diode 120 is emitted to above the substrate SUB on which the light emitting diode 120 is disposed. In this case, the anode 121 may further include a transparent conductive layer and a reflective layer on the transparent conductive layer. The transparent conductive layer may be made of a transparent conductive oxide such as ITO, IZO, etc. The reflective layer may be made of, for example, silver (Ag), aluminum (Al), gold (Au), molybdenum (Mo), tungsten (W), chromium (Cr), or an alloy thereof.

A bank 116 may be disposed covering the anode 121. The bank 116 may have an open portion corresponding to an emission area of the sub-pixel. A part of the anode 121 may be exposed through the open portion (hereinafter, referred to as "open area") of the bank 116. Herein, the bank 116 may be made of an inorganic insulating material such as silicon nitride (SiNx) and silicon oxide (SiOx), or an organic insulating material such as a benzocyclobutene resin, an acrylic resin, or an imide resin. However, the present disclosure is not limited thereto. Although not illustrated in the drawings, a spacer may be further disposed on the bank 116.

An emission layer 122 may be disposed in and around the open area of the bank 116. Accordingly, the emission layer 122 may be disposed on the anode 121 exposed through the open area of the bank 116.

A cathode 123 may be disposed on the emission layer 122.

The light emitting diode 120 may be composed of the anode 121, the emission layer 122, and the cathode 123. The emission layer 122 may include a plurality of organic films.

The encapsulation layer ENCAP may be located on the light emitting diode layer EDL.

The encapsulation layer ENCAP may have a monolayer structure or a multilayer structure. For example, the encapsulation layer ENCAP may include a first encapsulation layer 117a, a second encapsulation layer 117b, and a third encapsulation layer 117c.

Each of the first encapsulation layer 117a and the third encapsulation layer 117c may be an inorganic film, and the second encapsulation layer 117b may be an organic film. Among the first encapsulation layer 117a, the second encapsulation layer 117b, and the third encapsulation layer 117c, the second encapsulation layer 117b may be the thickest and may serve as a planarization layer.

The first encapsulation layer 117a is disposed on the cathode 123, and may be disposed most adjacent to the light emitting diode 120. The first encapsulation layer 117a may be made of an inorganic insulating material which is capable of being deposited at a low temperature. For example, the first encapsulation layer 117a may be made of silicon nitride (SiNx), silicon oxide (SiOx), silicon oxide nitride (SiON), aluminum oxide ($Al_2O_3$), or the like. Since the first encapsulation layer 117a is deposited under a low-temperature atmosphere, it is possible to suppress damage to the emission layer 122, which contains an organic material vulnerable to a high-temperature atmosphere, during the deposition process.

The second encapsulation layer 117b may be formed smaller in size than the first encapsulation layer 117a. In this case, the second encapsulation layer 117b may be formed to expose both ends of the first encapsulation layer 117a. The second encapsulation layer 117b may serve as a buffer for relieving stress between the layers caused by bending of the flexible display device and enhance the planarization performance.

For example, the second encapsulation layer 117b may be made of an organic insulating material such as acrylic resin, epoxy resin, polyimide, polyethylene, or silicon oxycarbide (SiOC). For example, the second encapsulation layer 117b may be formed by an inkjet printing method, but is not limited thereto.

The third encapsulation layer 117c may be formed on the substrate SUB on which the second encapsulation layer 117b is formed while covering upper surfaces and side surfaces of the second encapsulation layer 117b and the first encapsulation layer 117a. The third encapsulation layer 117c may minimize, reduce, or block permeation of moisture or oxygen from the outside into the first encapsulation layer 117a and the second encapsulation layer 117b. For example, the third encapsulation layer 117c may be made of an inorganic insulating material such as silicon nitride (SiNx), silicon oxide (SiOx), silicon oxide nitride (SiON), aluminum oxide ($Al_2O_3$), or the like.

A dam may be further disposed in the non-active area NA to block a flow of the second encapsulation layer 117b included in the encapsulation layer ENCAP. However, the present disclosure is not limited thereto. For example, the dam may be disposed in the non-active area NA in the form of a closed curve that encloses the active area AA. Also, the first encapsulation layer 117a and the third encapsulation layer 117c are disposed on the dam, and a flow of the second encapsulation layer 117b may be blocked by the dam.

Although not illustrated in the drawings, a color filter may be disposed on the encapsulation layer ENCAP. However, the present disclosure is not limited thereto.

The touch sensing layer TSL may be disposed on the encapsulation layer ENCAP.

For example, a touch buffer film 118a may be disposed on the third encapsulation layer 117c, and a touch electrode TE may be disposed on the touch buffer film 118a.

The touch electrode TE may include a touch sensor metal TS and a bridge metal BM located on different layers. A touch interlayer insulating film 118b may be disposed between the touch sensor metal TS and the bridge metal BM.

For example, the touch sensor metal TS may include a first touch sensor metal, a second touch sensor metal, and a third touch sensor metal disposed adjacent to each other. The first touch sensor metal and the second touch sensor metal are electrically connected to each other. However, the third touch sensor metal may be disposed between the first touch sensor metal and the second touch sensor metal. In this case, the first touch sensor metal and the second touch sensor metal may be electrically connected to each other through the bridge metal BM on a different layer. The bridge metal BM may be insulated from the touch sensor metal TS by the touch interlayer insulating film 118b.

When the touch sensing layer TSL is formed, a chemical solution (developer or etchant, etc.) may be used in the process, or moisture may be generated from the outside. In this case, the touch buffer film 118a may suppress permeation of the chemical solution or moisture into the emission layer 122 containing an organic material during the manufacturing process of the touch sensing layer TSL. Accordingly, the touch buffer film 118a may suppress damage to the emission layer 122 vulnerable to a chemical solution or moisture.

The touch buffer film 118a may be made of an organic insulating material that can be formed at a low temperature below a certain temperature (e.g., 100° C.) and has a low dielectric constant of 1 to 3. This is to suppress damage to the emission layer 122 containing an organic material vulnerable to high temperatures. For example, the touch buffer film 118a may be made of an acryl-based, epoxy-based, or siloxane-based material. As the flexible display device is bent, the encapsulation layer ENCAP may be damaged and the touch sensor metal TS on the touch buffer film 118a may be broken. The touch buffer film 118a is made of an organic insulating material and has the planarization performance. Thus, even if the flexible display device is bent, the touch buffer film 118a may suppress damage to the encapsulation layer ENCAP and breakage of the metals TS and BM of the touch electrode TE.

The protective layer PAC may be disposed to cover the touch electrode TE. The organic material layer 119 may be formed as an organic insulating film.

According to an exemplary embodiment of the present disclosure, when the organic material layer 119 is formed, a developer used in the process may remain on the organic material layer 119. This will be described later with reference to FIG. 5.

Although not illustrated in the drawings, a polarization layer may be further disposed on the organic material layer 119.

The polarization layer suppresses reflection of external light on the active area AA of the substrate 110. When the display device 100 is used outside, external natural light that enters may be reflected by the reflective layer included in the anode 121 of the light emitting diode 120. Alternatively, the external natural light may be reflected by an electrode made of a metal and disposed under the light emitting diode 120. Therefore, an image of the display device 100 may not be visibly recognized by the light reflected as described above. The polarization layer polarizes the light entering from the outside to a specific direction and suppresses emission of the reflected light to the outside of the display device 100.

Although not illustrated in the drawings, a cover glass may be bonded onto the polarization layer by an adhesive layer. The adhesive layer may serve to bond the components of the display device 100 to each other. Also, the adhesive layer may be made of an optical clear adhesive for displays, such as a pressure sensitive adhesive, an optical clear adhesive (OCA), and an optical clear resin (OCR), but is not limited thereto.

The cover glass may protect the components of the display device 100 from external impacts and suppress damage such as scratches.

Hereinafter, the plurality of lines 140 will be described in more detail with reference to FIG. 5 and FIG. 6.

Figure 5:
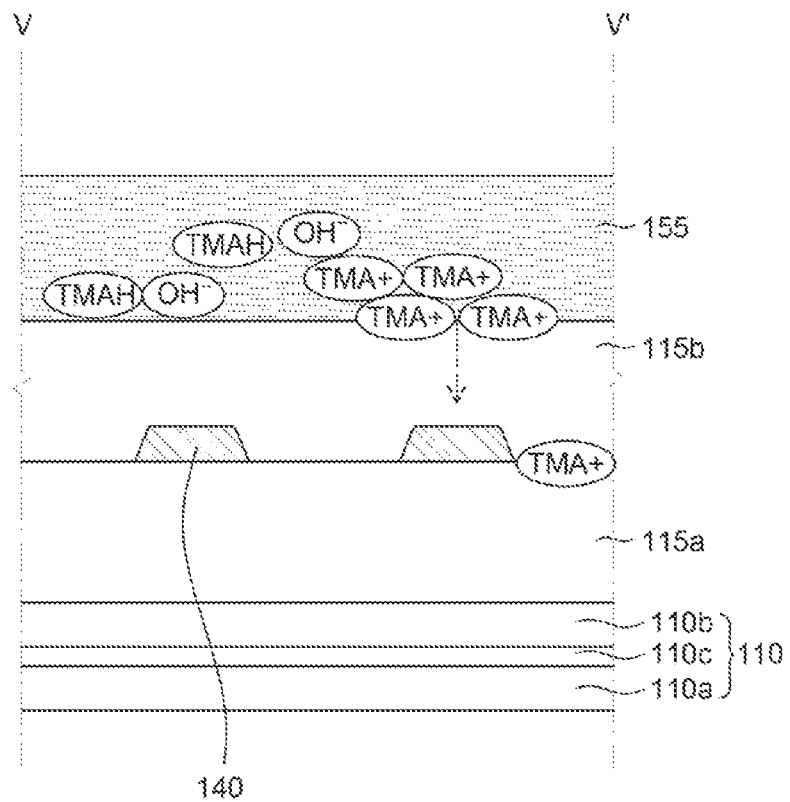
FIG. 5 is a cross-sectional view as taken along a line V-V' of FIG. 3 according to an exemplary embodiment of the present disclosure.

FIG. 5 is a cross-sectional view as taken along a line V-V' of FIG. 3 according to one embodiment.

Figure 6:
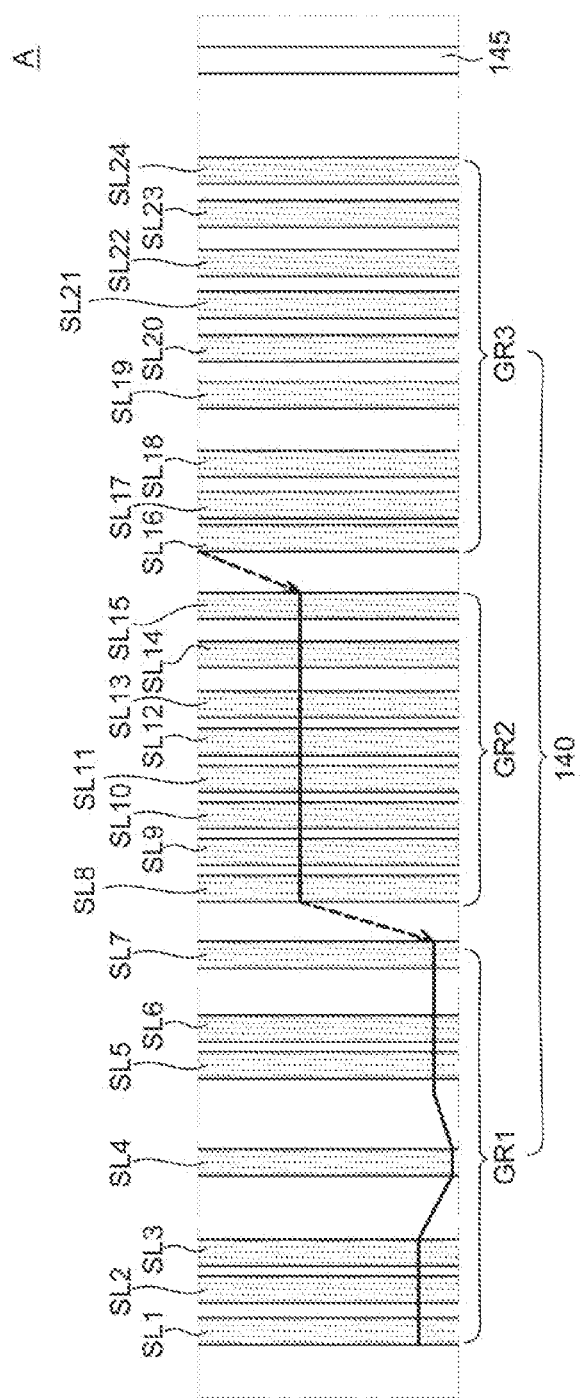
FIG. 6 is an enlarged view showing a portion A of FIG. 3 according to an exemplary embodiment of the present disclosure.

FIG. 6 is an enlarged view showing a portion A of FIG. 3 according to one embodiment.

FIG. 5 is a cross-sectional view of the plurality of lines 140 according to an exemplary embodiment of the present disclosure.

FIG. 6 is an enlarged view of the plurality of lines 140 of the display device 100 according to an exemplary embodiment of the present disclosure.

Referring to FIG. 5, the bending area BA according to an exemplary embodiment of the present disclosure includes the first planarization layer 115a on the substrate 110 and the second planarization layer 115b on the first planarization layer 115a. Also, the plurality of lines 140 may be disposed between the first planarization layer 115a and the second planarization layer 115b.

For example, the plurality of lines 140 may be made of the same material on the same layer as the connection electrode CE connected to the drain electrode 133 of the thin film transistor Td in the active area AA.

A micro coating layer 155 may be further disposed on the second planarization layer 115*b* in the bending area BA. However, the present disclosure is not limited thereto.

A tensile stress may be applied to the plurality of lines 140 disposed on the substrate 110 during bending and may cause a crack of the plurality of lines 140. The micro coating layer 155 is formed by coating a resin to a small thickness at a bending position to suppress the crack, and serves to protect the plurality of lines 140. Also, a protective layer such as the micro coating layer 155 disposed in the bending area BA may suppress the occurrence of a crack of the plurality of lines 140 disposed in the bending area BA. Also, the micro coating layer 155 may adjust a neutral plane of the bending area BA.

Conventionally, during an evaluation of driving reliability of a product, a crack may occur in a line (e.g., a gate circuit line) that is disposed in a bending area and supplies a driving signal from a driving integrated circuit to a gate driver. For example, a signal supply line may be corroded by tetramethylammonium hydroxide (TMAH) remaining on a second planarization layer in the bending area, and thus, a crack may occur in the signal supply line.

Specifically, mobile ions are generated on the bending area during the manufacturing process of the display device. For example, TMAH, which is a residual component of a developer used to develop the organic material layer disposed on the touch sensing layer TSL, may remain. If the remaining TMAH reacts with moisture ($H_2O$), TMAH may be dissociated into TMA+ cations (i.e., N(CH3)4+).

After the display device is manufactured, a voltage is applied to the gate circuit line disposed in the bending area to evaluate driving reliability of the product. Conventionally, when signal lines included in gate circuit lines are disposed, a high voltage line and a low voltage line among the gate circuit lines are designed to be adjacent to each other to reduce an electric field between signals with the same potential level. In this case, the electric field between the signals with the same potential level is 0, but an electric filed is generated between the high voltage line and the low voltage line. Due to the generated electric field, the TMA+ cations remaining on the bending area are attracted to the low voltage line with the lowest potential among the gate circuit lines. For example, as a specific line among the gate circuit lines maintains a low voltage for a longer time during driving at 1 Hz, the TMA+ cations may be more easily attracted to the low voltage line among the gate circuit lines and may cause corrosion.

However, according to an exemplary embodiment of the present disclosure, as shown in FIG. 6, a plurality of lines 140 serves as gate circuit lines for transmitting a signal from the driving integrated circuit 150 disposed in the pad area PA to the gate driver 154. The plurality of lines 140 includes a first group GR1 that transmits a signal having a first voltage as an average voltage, and a second group GR2 that transmits a clock signal. Also, the plurality of lines 140 includes a third group GR3 that transmits a signal having a second voltage, which is different from the first voltage, as an average voltage. The second group GR2 is located between the first group GR1 and the third group GR3 to minimize or reduce an electric field between adjacent signal lines included in the plurality of lines 140. Thus, it is possible to minimize or reduce transfer of charges and thus possible to minimize and/or suppress the occurrence of corrosion of the plurality of lines 140.

According to an exemplary embodiment of the present disclosure, the plurality of lines 140 may be divided into the first group GR1 including first to seventh signal lines SL1 to SL7 and the second group GR2 including eighth to fifteenth signal lines SL8 to SL15. Also, the plurality of lines 140 may be divided into the third group GR3 including sixteenth to twenty-fourth signal lines SL16 to SL24.

The first to twenty-fourth signal lines SL1 to SL24 may be disposed to be spaced apart from each other in an X-axis direction. Each of the signal lines SL1 to SL24 may extend in a direction different from the X-axis direction, for example, a Y-axis direction intersecting the X-axis direction, but is not limited thereto. For example, each of the signal lines SL1 to SL24 may extend in a direction oblique to the Y-axis direction. FIG. 6 illustrates that the plurality of lines 140 includes 24 signal lines SL1 to SL24. However, the number of signal lines included in the plurality of lines 140 is not limited thereto.

Each of the signal lines SL1 to SL24 included in the plurality of lines 140 may transmit a signal. Specifically, according to an exemplary embodiment of the present disclosure, the plurality of lines 140 may be disposed in an order of the level of an average voltage of a signal transmitted by each of the plurality of lines 140.

For example, the signal lines SL1 to SL7 included in the first group GR1 may transmit a signal having the lowest average voltage. Also, the signal lines SL16 to SL24 included in the third group GR3 may transmit a signal having the highest average voltage. The signal lines SL8 to SL15 disposed between them and included in the second group GR2 may swing between a logic low voltage VL and a logic high voltage VH. For example, a logic high voltage of the clock signal transmitted by the second group GR2 may be a third voltage close to the second voltage. Also, a logic low voltage of the clock signal transmitted by the second group GR2 may be a fourth voltage close to the first voltage.

As shown in FIG. 6, the signal lines SL1 to SL24 included in the plurality of lines 140 are disposed such that the second group GR2 that transmits the clock signal is disposed between the first group GR1 that transmits the signal having the lowest average voltage and the third group GR3 that transmits the signal having the highest average voltage. In this case, the signal lines SL8 to SL15 included in the second group GR2 are maintained at the logic high voltage close to the second voltage for one half of a predetermined period of time. Also, the signal lines SL8 to SL15 included in the second group GR2 are maintained at the logic low voltage close to the first voltage for the other half of the predetermined period of time. Therefore, the signal lines SL8 to SL15 included in the second group GR2 have the same potential as the signal lines SL1 to SL7 and SL16 to SL24 included in the first group GR1 and the third group GR3, respectively, depending on the time. Thus, an electric field may be 0.

When the signal lines SL8 to SL15 included in the second group GR2 are at the logic low voltage close to the first voltage, generation of an electric field between the adjacent first group GR1 and the second group GR2 may be suppressed. When the signal lines SL8 to SL15 included in the second group GR2 are at the logic high voltage close to the second voltage, an electric field may be generated between the adjacent first group GR1 and the second group GR2.

According to an exemplary embodiment of the present disclosure, an electric field is generated between the adjacent first group GR1 and the second group GR2 for half the time compared to the conventional arrangement of signal lines included in gate circuit lines. Thus, a stress caused by the electric field and applied to the signal lines SL1 to SL7 included in the first group GR1 that transmits the signal having the lowest average voltage may be reduced to half.

Therefore, transfer of charges may be minimized and/or suppressed by minimizing or reducing an electric field between adjacent signal lines included in the plurality of lines 140. Accordingly, it is possible to minimize and/or suppress the occurrence of corrosion of the plurality of lines 140.

For example, the signal lines SL1 to SL7 included in the first group GR1 of the plurality of lines 140 may include an initialization signal, a low voltage signal, a start signal, and a monitor signal. Also, the signal lines SL8 to SL15 included in the second group GR2 may include a clock signal. Further, the signal lines SL16 to SL24 included in the third group GR3 may include a correction voltage signal, a high voltage signal, a monitor signal, and a start signal. However, the present disclosure is not limited thereto.

According to an exemplary embodiment of the present disclosure, the plurality of lines 140 may be disposed in order of the third group GR3, the second group GR2, and the first group GR1 from the outer periphery toward the center of the substrate 110.

When TMAH reacts with moisture ($H_2O$), TMAH is dissociated into TMA+ ions. Since moisture ($H_2O$) permeates first from the outer periphery of the display device 100, the first group GR1 including the gate low voltage lines prone to reacting with the TMA+ ions is disposed at the center of the substrate 110. Also, the third group GR3 including the gate high voltage lines less prone to reacting with the TMA+ ions is disposed at the outer periphery of the substrate 110. Thus, it is possible to suppress corrosion of the plurality of lines 140 disposed in the bending area BA.

According to an exemplary embodiment of the present disclosure, if the arrangement of the plurality of lines 140 is modified, the signal lines SL1 to SL24 connected to the plurality of lines 140 and the gate driver 154 may be changed in length. However, the present disclosure is not limited thereto.

Hereinafter, a display device according to another exemplary embodiment of the present disclosure will be described with reference to FIG. 7.

Figure 7:
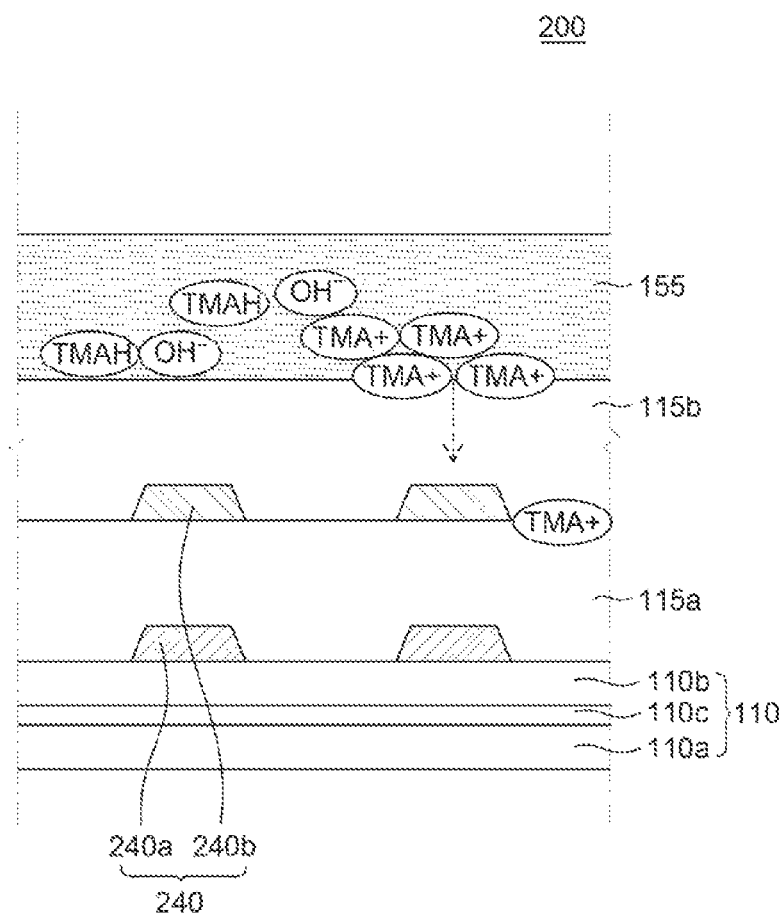
FIG. 7 is a cross-sectional view of a bending area according to another exemplary embodiment of the present disclosure.

FIG. 7 is a cross-sectional view of a bending area according to another embodiment of the present disclosure.

A display device 200 of FIG. 7 is substantially the same as the display device 100 of FIG. 1 through FIG. 6 except that a plurality of lines 240 has a multilayer structure. Therefore, a repeated description thereof will be omitted.

Referring to FIG. 7, in the display device 200 according to another exemplary embodiment of the present disclosure, the bending area BA includes the first planarization layer 115a on the substrate 110 and the second planarization layer 115b on the first planarization layer 115a. The plurality of lines 240 may be disposed between the first planarization layer 115a and the second planarization layer 115b.

For example, the plurality of lines 240 may have a multilayer structure. The multilayer structure includes a plurality of first lines 240a disposed between the substrate 110 and the first planarization layer 115a. Also, the multilayer structure includes a plurality of second lines 240b disposed between the first planarization layer 115a and the second planarization layer 115b.

For example, the plurality of first lines 240a may be made of the same material on the same layer as the source electrode 132 and the drain electrode 133 of the thin film transistor Td in the active area AA. Also, the plurality of second lines 240b may be made of the same material on the same layer as the connection electrode CE connected to the drain electrode 133 of the thin film transistor Td in the active area AA.

Since the plurality of lines 240 has a multilayer structure, a resistance of the plurality of lines 240 may be reduced.

Further, even if TMA+ ions are introduced into the plurality of lines 240 and react with the plurality of lines 240, the plurality of first lines 240a as a lower part of the plurality of lines 240 may be protected by the plurality of second lines 240b. Thus, it is possible to apply a driving signal from the driving integrated circuit 150 to each of the plurality of pixels P.

The exemplary embodiments of the present disclosure can also be described as follows:

According to an aspect of the present disclosure, a display device, comprising: a substrate that includes a non-active area including a bending area and a pad area, and an active area; a gate driving circuit disposed in the non-active area; a driving integrated circuit disposed in the pad area; and a plurality of lines disposed in the bending area and connecting the driving integrated circuit to the gate driving circuit, wherein the plurality of lines includes: a first group that transmits a signal having a first voltage as an average voltage; a second group that transmits a clock signal; and a third group that transmits a signal having a second voltage, which is different from the first voltage, as an average voltage, and the second group is located between the first group and the third group.

The plurality of lines may be disposed in order of a level of an average voltage of a signal transmitted by each of the plurality of lines.

A logic high voltage of the clock signal transmitted by the second group may be a third voltage close to the second voltage, and a logic low voltage of the clock signal transmitted by the second group may be a fourth voltage close to the first voltage.

The plurality of lines may be disposed in order of the third group, the second group, and the first group from an outer periphery toward a center of the substrate.

A plurality of lines included in the first group may serve as gate low voltage lines.

A plurality of lines included in the third group may serve as gate high voltage lines.

The display device may further include a thin film transistor disposed in the active area on the substrate; a first planarization layer disposed on the thin film transistor; a second planarization layer disposed on the first planarization layer; a plurality of light emitting diodes disposed on the second planarization layer; an encapsulation layer disposed to cover the plurality of light emitting diodes; and a touch sensing layer disposed on the encapsulation layer.

The display device may further include a connection electrode disposed on the first planarization layer and connecting a drain electrode of the thin film transistor to the light emitting diodes.

The first planarization layer and the second planarization layer are disposed in the bending area, and the plurality of lines may be disposed between the first planarization layer and the second planarization layer and made of the same material on the same layer as the connection electrode.

At least one of the first planarization layer and the second planarization layer is disposed in the bending area, and the plurality of lines may have a multilayer structure including a plurality of first lines disposed between the substrate and the first planarization layer and a plurality of second lines disposed on the first lines.

The plurality of second lines may be disposed between the first planarization layer and the second planarization layer.

The plurality of first lines is made of the same material on the same layer as a source electrode and the drain electrode of the thin film transistor, and the plurality of second lines may be made of the same material on the same layer as the connection electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate that includes a non-active area and an active area, the non-active area including a bending area and a pad area;
   a thin film transistor in the active area on the substrate;
   a first planarization layer on the thin film transistor;
   a second planarization layer on the first planarization layer;
   a plurality of light emitting diodes on the second planarization layer;
   an encapsulation layer configured to cover the plurality of light emitting diodes;
   a touch sensing layer includes a touch buffer layer disposed on the encapsulation layer, a bridge metal of the touch buffer layer a touch interlayer insulating film to cover the bridge metal, and a touch sensor metal disposed on the touch interlayer insulating film;
   an organic material layer configured to cover the touch sensor metal;
   a gate driving circuit in the non-active area;
   a driving integrated circuit in the pad area; and
   a plurality of lines in the bending area, the plurality of lines connecting the driving integrated circuit to the gate driving circuit,
   wherein the plurality of lines includes:
     a first group of lines that transmits a first signal having a first average voltage;
     a second group of lines that transmits a clock signal; and
     a third group of lines that transmits a second signal having a second average voltage that is different from the first average voltage, and
     wherein the second group of lines is located between the first group of lines and the third group of lines.

2. The display device according to claim 1, wherein the plurality of lines are arranged in an order of a level of an average voltage of a signal transmitted by each of the plurality of lines.

3. The display device according to claim 1, wherein a logic high voltage of the clock signal transmitted by the second group of lines is a third voltage close to the second average voltage, and a logic low voltage of the clock signal transmitted by the second group of lines is a fourth voltage close to the first average voltage.

4. The display device according to claim 1, wherein the plurality of lines are arranged in order of the third group of lines, the second group of lines, and the first group of lines from an outer periphery toward a center of the substrate.

5. The display device according to claim 1, wherein a first plurality of lines included in the first group of lines serve as gate low voltage lines.

6. The display device according to claim 1, wherein a second plurality of lines included in the third group of lines serve as gate high voltage lines.

7. The display device according to claim 1, further comprising:
   a connection electrode on the first planarization layer, the connection electrode connecting a drain electrode of the thin film transistor to the plurality of light emitting diodes.

8. The display device according to claim 7, wherein the first planarization layer and the second planarization layer are in the bending area, and
   the plurality of lines are between the first planarization layer and the second planarization layer, the plurality of lines comprising a same material and on a same layer as the connection electrode.

9. The display device according to claim 7, wherein at least one of the first planarization layer and the second planarization layer is in the bending area, and
   the plurality of lines has a multilayer structure including:
     a plurality of first lines between the substrate and the first planarization layer, and
     a plurality of second lines on the plurality of first lines.

10. The display device according to claim 9, wherein the plurality of second lines are between the first planarization layer and the second planarization layer.

11. The display device according to claim 10, wherein the plurality of first lines are made of a same material and on a same layer as a source electrode and the drain electrode of the thin film transistor, and the plurality of second lines are made of a same material and on a same layer as the connection electrode.

12. The display device according to claim 1, further comprising:
   a crack detection line disposed outside the plurality of lines.

13. The display device according to claim 12, wherein the crack detection line disposed to enclose the active area.

14. The display device according to claim 12, wherein the crack detection line is connected to the driving integrated circuit.

15. The display device according to claim 1, when the substrate is bent in the bending area, the driving integrated circuit and the pad area overlap the active area in a rear side direction of the active area.

* * * * *